July 5, 1966 M. W. GREEN 3,259,814

POWER SEMICONDUCTOR ASSEMBLY INCLUDING HEAT DISPERSING MEANS

Filed May 20, 1955

INVENTOR.
Milton W. Green
BY J. L. Whittaker
ATTORNEY

United States Patent Office 3,259,814

Patented July 5, 1966

3,259,814

POWER SEMICONDUCTOR ASSEMBLY INCLUDING HEAT DISPERSING MEANS

Milton W. Green, Princeton, N.J., assignor to Radio Corporation of America, a corporation of Delaware Filed May 20, 1955, Ser. No. 509,806
10 Claims. (Cl. 317—235)

This invention relates generally to improved semiconductor devices such as power transistors, and particularly to improved means for mounting and for providing thermal dissipation in power transistors and semiconductor devices.

The purposes and objects of this invention include providing an improved power transistor, and providing an improved hermetically sealed power transistor having an effective heat sink for thermal dissipation and having a single-ended construction whereby the single act of inserting the transistor into a circuit effects both electrical contact to the transistor leads and operation of the heat sink.

In general, the principles and objects of this invention are accomplished by providing a power transistor including a body of semiconductor material having emitter and collector electrodes, and having a large-volume, electrically and thermally conductive member, or heat sink, in intimate heat transfer relation with the emitter or collector electrode. This member thus provides both mechanical and electrical support for the transistor and, in addition, provides cooling thereof. The conductive member comprises a metal disk having a low pedestal which is secured to the selected electrode, and preferably, the cross-sectional area of the disk is equal to or greater than the cross-sectional area of the pedestal at the area of contact with the selected electrode. The conductive member carries electrical lead wires for making contact to the emitter and base electrodes. The member is provided with a metal ring to which a closure cap is hermatically sealed to provide a gas-tight enclosure for the transistor. The device is adapted to be mounted with the conductive member secured to a chassis whereby optimum heat transfer and mounting strength are achieved.

The invention is described in greater detail by reference to the drawing wherein.

Similar elements are designated by similar reference characters throughout the drawing.

Figures 1, 2, 3, 4:
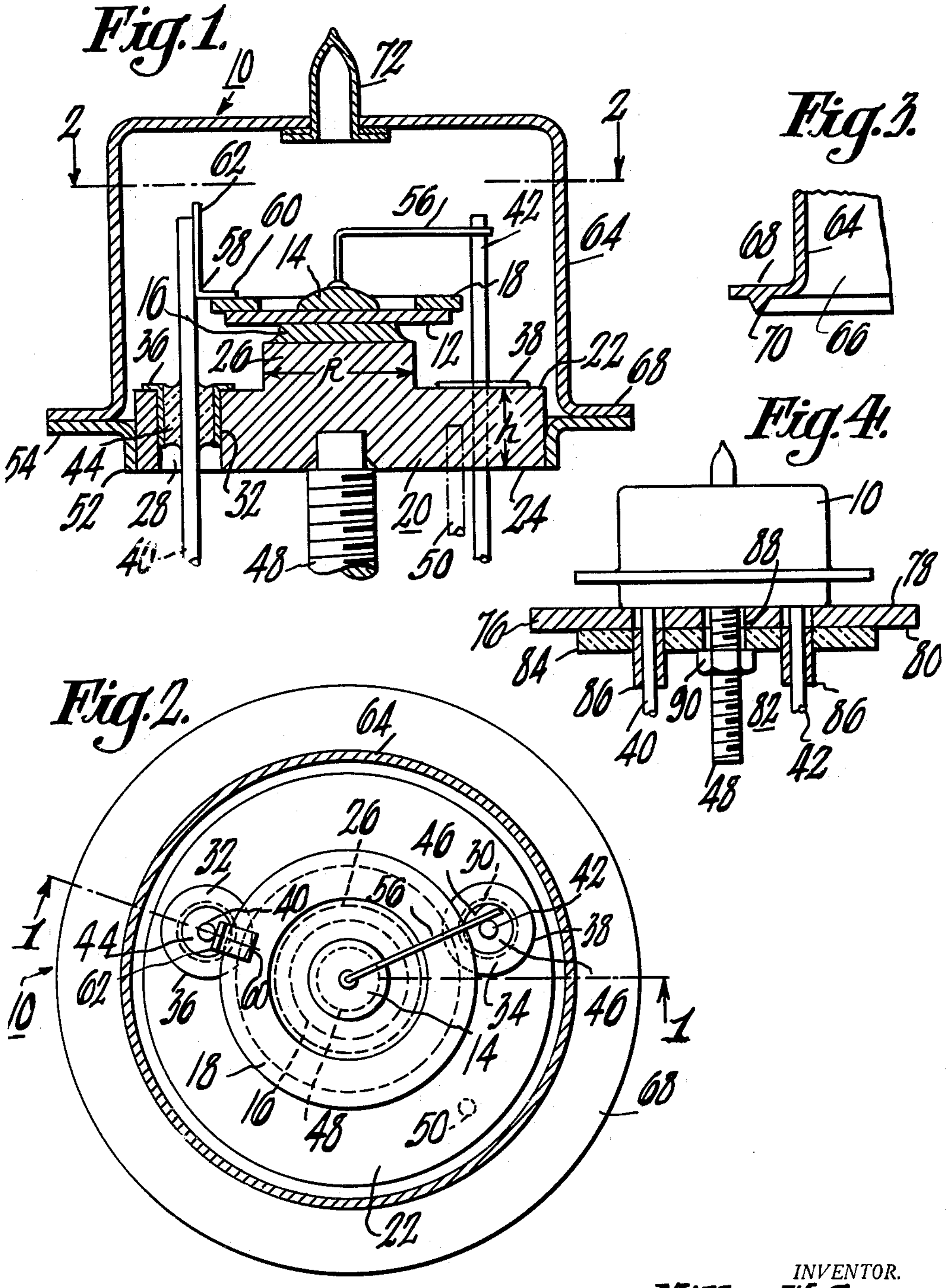
FIG. 1 is a sectional elevational view of a device embodying the principles of the invention and taken on the line 1—1 of FIG. 2.
FIG. 2 is a sectional view along the line 2—2 in FIG. 1.
FIG. 3 is a sectional view of a portion of the device shown in FIG. 1.
FIG. 4 is an elevational view, partly in section, of a power transistor embodying the principles of the invention and a circuit mounting arrangement therefor.

Referring to FIGURE 1, a power transistor 10 embodying the principles of the invention includes a wafer 12 prepared from a thin slice of a single crystal of semiconductor material, for example, germanium or silicon or the like, of N-type or P-type conductivity. The wafer 12 is provided with an emitter rectifying electrode 14 and a collector rectifying electrode 16 which have comparatively large cross-sectional areas and which may be of any desired type. However, the emitter and collector electrodes are preferably P-N junction electrodes of the type formed by an alloying or fusion process such as described generally in a paper by Law et al., entitled "A Developmental Germanium P-N-P Junction Transistor" in the November 1952 Proceedings of the IRE. The wafer 12 is also provided with a base electrode 18 in the form of a ring soldered to the wafer closely surrounding the emitter electrode and in ohmic (non-rectifying) contact with the crystal.

A metallic member 20 known as a header is provided for supporting the transistor, for providing electrical contact thereto, and for providing cooling thereof. In devices of the present invention, the header comprises preferably a large-volume thermally and electrically conductive disk having a top surface 22 and a bottom surface 24 which are substantially plane and parallel and having a low central pedestal 26 generally cylindrical in form and of large area (larger than the collector electrode) rising from the surface 22. The header is also perforated with two holes 28 and 30 in which cylindrical eyelets 32 and 34, respectively, are hermetically sealed. The eyelets have peripheral flanges 36 and 38 at one end which abut the top surface 22 of the header 20. The eyelets have metal rods 40 and 42, respectively, hermetically sealed therein by means of insulating beads 44 and 46, respectively. The rods 40 and 42 extend a considerable distance above and below the header. The header 20 also is provided with a mounting screw 48 extending from approximately the center of the surface 24 and a metal rod 50 extending from a selected point on the surface 24. The rods 40, 42 and 50 and the screw 48 all extend away from the surface 24 substantially parallel to each other. The rods 40, 42 and 50 comprise electrical contact pins in the completed device.

A metal header ring 52 having a wide peripheral flange 54 is hermetically sealed to the periphery of the header 20.

Since most of the heat developed in a transistor is generated at the junction between the collector electrode 16 and the semiconductor wafer 12, the collector electrode is secured to the pedestal 26 of the header 20. Thus, an effective heat sink is provided for the device. The rod 42 is electrically connected to the emitter electrode 14 by means of a wire 56 and the rod 40 is connected to the ring-shaped base electrode 18 by means of a generally L-shaped thin, flexible metal strip 58 having a leg 60 bonded to the base ring and a leg 62 bonded to the rod 40. If desired, the transistor may be reversed and the emitter electrode may be secured to the header pedestal.

Referring to FIGURE 3, a header cap 64 which provides a closure for the device 10 is generally cylindrical in form and has an open end 66 bounded by a peripheral flange 68 which is provided with an embossment 70. The header cap is hermetically sealed to the header ring with the flanges 54 and 68 bonded together. A hollow metal tube 72 is provided in the wall of the header cap 64 and affords access to the interior of the device during the assembly thereof after which it is sealed off.

In preparing the power transistor 10 described above, the wafer 12 is first cut fom a single-crystalline body of semiconductor material, for example, N-type germanium. The wafer is cleaned and etched as require and the emitter and collector P-N junction electrodes 14 and 16, respectively, are formed by fusing dots of a suitable impurity material, for example, indium with the wafer 12 such that part of the indium alloys with the germanium. The ring base electrode 18 of nickel or the like is then soldered to the wafer surface surrounding the emitter electrode 14 and the L-shaped connector strip 58 of nickel or the like is soft soldered to the base ring.

The header assembly is then prepared. The header is made, preferably, of a metal having high electrical and thermal conductivity, for example, copper, and the header ring 52 is made of cold-rolled steel having a light nickel plating and a flashing of silver. The eyelets 32 and 34 and the rods 40 and 42 are of a material, for example, a nickel-iron alloy (Kovar) which has a coefficient of expansion similar to that of the glass beads 44 and 46 by means of which the rods are secured within the eyelets. The screw 48 is, preferably, of steel and the rod 50 is of cold rolled steel.

In assembling the header and its components, the header ring 52, the steel screw 48 and the rod 50 are secured to the header 20, for example, by a brazing operation so that an hermetic seal is formed between the various parts. The eyelets 32 and 34 carrying the rods are soft soldered within the apertures 28 and 30 in the header.

The L-shaped metal strip 58 is then welded to the support rod 40 at such a position that the exposed portion of the collector electrode rests on the central pedestal 26 of the header 20. Since the strip 58 is flexible, it provides lever-type action by means of which the position of the wafer 12 may be adjusted to provide the desired contact between the collector and the header 20. The exposed portion of the collector electrode is then soldered to the pedestal. The emitter electrode 14 is then connected to the support rod 42 by means of the wire 56 which is welded at one end to the rod and at the other end, which has also been coated with Cerroseal, it is soldered to the exposed portion of the emitter electrode, which has been coated with a soft solder such as Cerroseal (50% indium, 50% tin). Cerroseal has a lower melting point than the indium and the soldered seal is thus made without melting the indium. Next, a suitable masking material, for example, a solution of polystyrene in toluol is applied to all portions of the semiconductor crystal wafer and its associated electrodes except to the emitter and collector dots and the portions of the wafer 12 immediately surrounding them. The device is then etched to remove surface contaminants and to clean up the portions of the wafer surrounding the emitter and collector electrodes. The masking material is then removed.

The header, which is also made of cold-rolled steel nickel plated and having a flashing of silver, is then hermetically sealed to the header ring 52, preferably, by an electrical resistance welding operation. The actual weld is formed between the flanges 68 of the cap 64 and the flange 54 of the ring 52 with the embossment 70 providing the desired contact resistance between the parts. The device is then evacuated through the tube 72 and after the desired degree of evacuation has been achieved, the tube is hermetically sealed off. If desired, instead of evacuating the device it may be filled with a suitable potting material, for example, a liquid, a plastic, or a gas at any desired pressure through the tube 72 before it is sealed.

In mounting the above-described power transistor 10 on a chassis, optimum heat dissipation is achieved with an arrangement of the type shown in FIGURE 4 wherein a portion of a chassis 76 having top and bottom surfaces 78 and 80, respectively, has an electrical socket 82 secured to the bottom surface thereof. The socket preferably has an insulating body 84 and electrical contact receptacles 86 embedded therein and surrounding a central aperture adapted to receive the mounting screw 48 of the device 10. The chassis is provided with a hole for the screw 48 and a suitable number of holes suitably positioned in alignment with the receptacles of the socket 82. The rods 40, 42 and 50 are oriented to pass each through one of the holes in the chassis to contact one of the contact receptacles. Thus, the device 10 is mounted with the screw 48 inserted through the openings in the chassis and in the socket and is secured in position by a nut 90 threaded on the screw and holding the header 20 in intimate engagement with the chassis 78 whereby a rugged mounting and an efficient cooling assembly are provided. The header is thus connected to a large heat sink. If electrical isolation between the header and the chassis is desired, an electrically insulating thermally conductive member such as an anodized aluminum washer may be inserted between the chassis and the header. The anodized aluminum is a good heat conductor and will afford electrical insulation to comparatively high voltages (in excess of 100 volts).

In a typical power transistor of the type described above, the semiconductor wafer is of N-type germanium and has dimensions of 200 x 250 x 10 mils. The emitter and collector P-N junction electrodes are made with impurity materials in the form of disks with the emitter impurity disk having a diameter of 100 mils and a thickness of 15 mils and the collector impurity disk having a diameter of 150 mils and a thickness of 20 mils. The header diameter is ⅝ inch and its thickness is ⅛ inch. The header pedestal is 200 mils in diameter and 75 mils high.

Considering the construction of the header from a more fundamental view point, assuming that the transistor is to be employed in a mechanical arrangement wherein the header is not in contact with a heat sink, such as a metal chassis, then for efficient heat transfer, the height or thickness, "$h$," of the header between the surfaces 22 and 24 should be equal to or greater than the radius, "R," of the pedestal. Thus, in effect, at the least, substantially the same area is provided for the flow of heat out of the header in the vicinity of the pedestal as flows into the pedestal from the transistor.

The combination of low pedestal and thick header described above provides a large effective body for the conduction of heat, while the large total volume of copper furnishes a high thermal capacity which is desirable for smoothing out the abrupt changes in temperature that often accompany rapid fluctuations in power dissipation. The greater the thermal capacity, the larger is the ratio of peak to average power than can be tolerated in operation of the transistor.

Transistors of the materials and dimensions described above when secured to a practical heat sink (such as a ⅛ inch thick aluminum chassis) have yielded values of coefficient of thermal drop of approximately 2.2° centigrade per watt. Such devices may be conservatively rated at 10 watts dissipation.

What is claimed is:

1. Semiconductor apparatus including a cap member having an open end, a closure member hermetically sealed to said cap member within said open end and comprising a metallic heat conducting member, said closure member having a pair of substantially parallel surfaces and having a generally circular pedestal rising from one of said surfaces within said cap member, the thickness of said closure member between said two surfaces being at least equal to the radius of said pedestal and a semiconductor device disposed within said cap member and including a base electrode and comparatively large area rectifying emitter and collector electrodes and having said collector electrode bonded to said pedestal, and a pair of electrical contact members insulatingly supported by said closure member and making electrical contact with said emitter and base electrodes.

2. A semiconductor device comprising a body of semiconductor material, emitter and collector rectifying electrodes in contact with said body, a base electrode in non-rectifying contact with said body, a large-volume heat conducting member secured in heat conducting relation to one of said rectifying electrodes, an electrical connector in contact with each of said other rectifying electrode and said base electrode and insulatingly mounted on said heat-conducting member, a ring member secured to said heat conducting member, and a cap member hermetically sealed to said ring member.

3. A semiconductor device comprising a body of semiconductor material, emitter and collector rectifying electrodes in contact with said body, a base electrode in non-rectifying contact with said body, a large-volume heat conducting member having a pair of parallel surfaces and a pedestal rising from one of said surfaces, one of said rectifying electrodes being secured to said pedestal in intimate heat transfer relation therewith, an electrical connector in contact with the other of said rectifying electrodes and said base electrode and insulatingly secured to said heat-conducting member, a ring member secured to said heat conducting member, and a cap member hermetically sealed to said ring member.

4. A semiconductor device comprising a body of semiconductor material, emitter and collector electrodes in rectifying contact with said body, a base electrode in non-rectifying contact with said body, a large-volume heat conducting member having a pedestal rising from one portion thereof and intimately bonded in heat conducting relation to said collector electrode, a pair of conductive members insulatingly supported on said heat conducting member and in electrical contact with each of said emitter and base electrodes, a ring member secured to said heat conducting member, and a cap member hermetically sealed to said ring member.

5. A semiconductor device comprising a body of semiconductor material, emitter and collector electrodes in rectifying contact with said body, a base electrode in non-rectifying contact with said body, a large-volume heat conducting member having a pedestal rising from one portion thereof and intimately bonded to said collector electrode, a pair of conductive rods insulatingly supported on said conducting member, one of said rods being electrically connected to said emitter electrode by a fine wire, the other of said rods being electrically connected to said base electrode by a thin flexible strip of metal, a ring member secured to said heat conducting member, and a cap member hermetically sealed to said ring member.

6. A semiconductor device comprising a body of semiconductor material, emitter and collector electrodes in rectifying contact with said body, a ring-shaped base electrode in non-rectifying contact with said body, a large-volume heat conducting member having a pair of parallel surfaces with a pedestal rising from one surface and secured to said collector electrode and in intimate heat transfer relation therewith, a pair of conductive rods insulatingly supported in said conducting member and in electrical contact with said emitter and base electrodes, a mounting member and another conductive rod secured to said conducting member, each of said rods and said mounting member having a portion extending from the other of said surfaces of said heat conducting member, a metal ring secured to said heat conducting member and having a peripheral flange, and a cap member having a peripheral flange hermetically sealed to said ring flange and enclosing said body and its associated electrodes and a tube sealed in the wall of said cap member for use in evacuating or encapsulating said device.

7. Semiconductor apparatus including a cap member having an open end, a closure member hermetically sealed to said cap member across said open end and comprising a metallic heat conducting member, said closure member having a pedestal rising from a surface thereof within said cap member, a semiconductor device disposed within said cap member and including a base electrode, and at least one comparatively large area rectifying electrode which is bonded to said pedestal, and at least one electrical contact member insulatingly supported by said closure member and making electrical contact with said base electrode.

8. A semiconductor device comprising a body of semiconductor material, emitter and collector rectifying electrodes in contact with said body, a base electrode in non-rectifying contact with said body, a large-volume heat conducting member secured in heat conducting relation to one of said rectifying electrodes, an electrical connector in contact with the other of said rectifying electrodes, and an electrical connector in contact with said base electrode, said electrical connectors being insulatingly mounted on said heat-conducting member, a member having a mounting surface extending outwardly from said heat conducting member, and a cap member hermetically sealed to said mounting surface of said member.

9. A semiconductor device comprising a body of semiconductor material, emitter and collector rectifying electrodes in contact with said body, a base electrode in non-rectifying contact with said body, a large-volume heat conducting member secured in heat conducting relation to one of said rectifying electrodes, an electrical connector in contact with the other of said rectifying electrodes, and an electrical connector in contact with said base electrode, said electrical connectors being insulatingly mounted on said heat conducting member, said heat conducting member having a mounting surface and a cap member hermetically sealed to said mounting surface of said heat conducting member.

10. A transistor assembly comprising an enclosure consisting of a header composed of a material of high thermal conductivity and a container of high thermal conductivity open at one end and closed at its other end, said container affixed to and being closed by said header at its open end whereby said header and said container together define a completely enclosed space, a transistor having a pair of regions of one-type conductivity separated by a region of opposite-type conductivity, one of said pair of regions of said transistor fixed directly to said header within said enclosed space, a plurality of leads connected to said transistor and extending through said header and insulated therefrom, and an element composed of a material of high thermal conductivity attached to said enclosure for fixing said assembly to a supporting structure of good thermal characteristics, in heat exchange relationship therewith which if grounded enables said transistor to operate as a grounded type.

References Cited by the Examiner

UNITED STATES PATENTS

| | | | |
|---|---|---|---|
| 2,383,735 | 8/1945 | Ray | 317—234 |
| 2,676,274 | 4/1954 | Kobayashi | 317—234 |
| 2,725,505 | 11/1955 | Webster et al. | 317—235 |

JOHN W. HUCKERT, *Primary Examiner.*

SAMUEL BERNSTEIN, GEORGE N. WESTBY, *Examiners.*

A. B. GOODALL, J. D. KALLAM, *Assistant Examiners.*